United States Patent
Sun et al.

(10) Patent No.: US 10,068,857 B2
(45) Date of Patent: Sep. 4, 2018

(54) SEMICONDUCTOR PACKAGE ASSEMBLY

(71) Applicant: MEDIATEK INC., Hsin-Chu (TW)

(72) Inventors: Ruey-Bo Sun, Taipei (TW);
Sheng-Mou Lin, Hsinchu (TW);
Wen-Chou Wu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/794,128

(22) Filed: Oct. 26, 2017

(65) Prior Publication Data

US 2018/0122747 A1 May 3, 2018

Related U.S. Application Data

(60) Provisional application No. 62/414,830, filed on Oct. 31, 2016.

(51) Int. Cl.
| | |
|---|---|
| *H01L 23/552* | (2006.01) |
| *H01L 23/66* | (2006.01) |
| *H01L 23/495* | (2006.01) |
| *H01L 49/02* | (2006.01) |
| *H01L 23/522* | (2006.01) |

(52) U.S. Cl.
CPC ........ *H01L 23/552* (2013.01); *H01L 23/4951* (2013.01); *H01L 23/5227* (2013.01); *H01L 23/66* (2013.01); *H01L 28/10* (2013.01); *H01L 2223/6677* (2013.01)

(58) Field of Classification Search
None
See application file for complete search history.

(56) References Cited

U.S. PATENT DOCUMENTS

| | | | |
|---|---|---|---|
| 8,963,645 B1 | 2/2015 | Helms et al. | |
| 9,245,835 B1 | 1/2016 | Jiang et al. | |
| 2003/0198032 A1* | 10/2003 | Collander | H01L 23/5387 361/760 |
| 2006/0290421 A1* | 12/2006 | Ichitsubo | H01L 23/66 330/66 |
| 2011/0170231 A1 | 7/2011 | Chandrasekaran et al. | |

FOREIGN PATENT DOCUMENTS

WO 99/57763 A1 11/1999

* cited by examiner

*Primary Examiner* — Karen Kusumakar
(74) *Attorney, Agent, or Firm* — McClure, Qualey & Rodack, LLP

(57) ABSTRACT

The invention provides a semiconductor package assembly. The semiconductor package assembly includes a substrate, a semiconductor die, a base and a first inductor structure. The substrate has a die-attach surface and a solder-ball-attach surface opposite to the die-attach surface. The semiconductor die is mounted on the die-attach surface of the substrate. The semiconductor die includes a radio-frequency (RF) circuit and a first RF die pad electrically connected to the RF circuit. The base is mounted on the solder-ball-attach surface of the substrate. The first inductor structure is positioned on the substrate, the semiconductor die or the base. The first inductor structure includes a first terminal electrically connected to the first die pad and a second terminal electrically connected to a ground terminal.

36 Claims, 7 Drawing Sheets

SEMICONDUCTOR PACKAGE ASSEMBLY

CROSS REFERENCE TO RELATED APPLICATIONS

This application claims the benefit of U.S. Provisional Application No. 62/414,830 filed Oct. 31, 2016, the entirety of which is incorporated by reference herein.

BACKGROUND OF THE INVENTION

Field of the Invention

The present invention relates to a semiconductor package assembly, and in particular to an inductor structure integrated with a system-on-a-chip (SoC) package assembly.

Description of the Related Art

In order to ensure miniaturization and multi-functionality of electronic products and communication devices, it is desired that semiconductor packages be small in size, to support multi-pin connection, high speeds, and high functionality. The multi-functional system-on-a-chip (SoC) package includes a single chip that integrates multiple functional circuits that are typically needed for a system into the single chip itself In the design of a system-on-a-chip (SoC) package for radio frequency (RF) applications, however, the integrated RF digital and analog circuits cause an undesired noise coupling problem.

Thus, a novel semiconductor package assembly is desirable.

BRIEF SUMMARY OF THE INVENTION

An exemplary embodiment of a semiconductor package assembly is provided. The semiconductor package assembly includes a substrate, a semiconductor die, a base and a first inductor structure. The substrate has a die-attach surface and a solder-ball-attach surface opposite to the die-attach surface. The semiconductor die is mounted on the die-attach surface of the substrate. The semiconductor die includes a radio-frequency (RF) circuit and a first die pad electrically connected to the RF circuit. The base is mounted on the solder-ball-attach surface of the substrate. The first inductor structure is positioned on the substrate, the semiconductor die or the base. The first inductor structure includes a first terminal electrically connected to the first die pad and a second terminal electrically connected to a ground terminal.

Another exemplary embodiment of a semiconductor package assembly includes a semiconductor die, a substrate, a first inductor structure and an antenna. The semiconductor die is mounted on a base. The semiconductor die includes a radio-frequency (RF) circuit and a first die pad electrically connected to the RF circuit. The substrate is positioned between the semiconductor die and the base. The first inductor structure is positioned on the substrate, the semiconductor die or the base. The first inductor structure includes a first terminal electrically connected to the first die pad and a second terminal electrically connected to a ground terminal. The antenna is positioned on the base and electrically connected to the first die pad without passing through the first inductor structure.

Yet another exemplary embodiment of a semiconductor package assembly includes a semiconductor die, a substrate, a first inductor structure and an antenna. The semiconductor die is mounted on a base. The semiconductor die includes a radio-frequency (RF) circuit and a first die pad electrically connected to the RF circuit. The substrate is positioned between the semiconductor die and the base. The first inductor structure is positioned on the substrate, the semiconductor die or the base. The first inductor structure includes a first terminal electrically connected to the first die pad and a second terminal electrically connected to ground. The antenna is positioned on the base and electrically connected to the first die pad. A first distance of a first conductive path from the second terminal of the first inductor structure to the first die pad is shorter than a second distance of a second conductive path from the antenna to the first die pad. The first die pad is between the first conductive path and the second conductive path.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
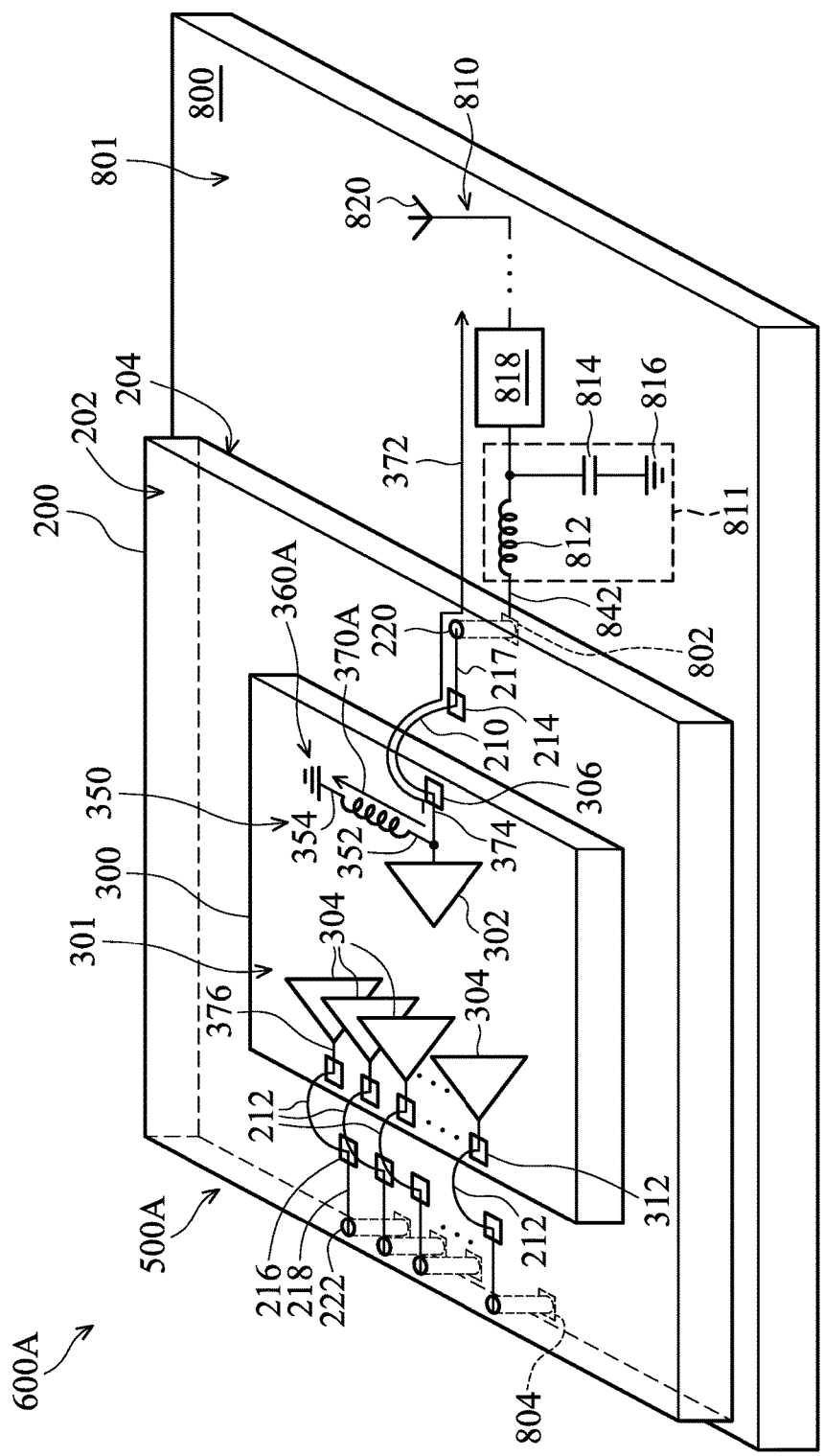
FIGS. 1-4 are circuit diagrams of a semiconductor package assembly in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a semiconductor package assembly. The semiconductor package assembly is a system-on-a-chip (SoC) package assembly. The semiconductor package assembly includes at least a semiconductor die, a substrate, a base (e.g. a printed circuit board (PCB)) and an individual inductor structure. The semiconductor die is a radio frequency (RF) SoC die. The individual inductor structure is arranged to be close to and electrically connected to a die pad of an RF circuit of the semiconductor die. The individual inductor structure has two terminals. One terminal of the individual inductor structure is electrically connected to and in physical contact with the die pad of an RF circuit of the semiconductor die, the other terminal of the individual inductor is electrically connected to ground without passing through any additional electronic devices. The individual inductor structure can reduce noise interference from the digital/analog circuit of the semiconductor die.

FIGS. 1-4 are circuit diagrams of semiconductor package assemblies 600A, 600B, 600C and 600D in accordance with some embodiments of the disclosure. In some embodiments, the semiconductor package assembly 600A includes a semiconductor package 500A (e.g. a radio frequency (RF) system-on-a-chip (SoC) package, or a radio frequency (RF) system-in-package (SiP) mounted on a base 800). In addition, the semiconductor package 500A includes a semiconductor die 300 and a substrate 200. Similarly, the semiconductor package assembly 600B/600C/600D includes a semiconductor package 500B/500C/500D (e.g. a radio frequency (RF) system-on-a-chip (SoC) package, or a radio frequency (RF) system-in-package (SiP) mounted on the base 800. In addition, the semiconductor package 500B/500C/500D includes a semiconductor die 300 and a substrate 200. It should be noted that the substrate 200 and the semiconductor die 300 are discrete, individual elements of the semiconductor package assembly 500A/500B/500C/500D. For clearly showing the arrangement of the semiconductor die 300 and the substrate 200 of a semiconductor package 500A/500B/500C/500D and the base 800. A molding compound of the semiconductor package 500A/500B/500C/500D is not shown in FIGS. 1-4.

As shown in FIG. 1, the semiconductor package 500A of the semiconductor package assembly 600A is mounted on a package-attach surface 801 of the base 800 through a plurality of conductive structures (not shown). In some embodiments, the base 800 may include a printed circuit board (PCB). The conductive structures may include conductive bump structures such as copper bumps, solder ball structures, solder bump structures, conductive pillar structures, conductive wire structures, or conductive paste structures.

In some embodiments, the base 800 of the semiconductor package assembly 600A includes several discrete pads 802 and 804 and at least an off-die component circuit 810 disposed close to the package-attach surface 801. The pad 802 may serve as input/output (I/O) connections for an RF circuit 302 of the semiconductor die 300. Therefore, the pads 802 also serve as RF pads of the base 800. In addition, the pads 804 may serve as input/output (I/O) connections for a digital/analog circuit 304 of the semiconductor die 300. Therefore, the pads 804 also serve as digital/analog pads of the base 800.

As shown in FIG. 1, the off-die component circuit 810 is electrically connected to the pad 802. In other words, off-die component circuit 810 may be electrically connected to the RF circuit 302 of the semiconductor die 300 through the pad 802. The off-die component circuit 810 is configured to match a wide range of impedances in the RF circuits (e.g. the RF circuit 302 of the semiconductor die 300), or to perform filtering function. The off-die component circuit 810 may include a matching circuit (e.g. an inductor-capacitor circuit) 811, a filter 818 and an antenna 820. In some embodiments, as shown in FIG. 1, the matching circuit 811 includes at least an inductor structure 812 and at least a capacitor 814 electrically connected to the inductor structure 812. The filter 818 may include a balun, a duplexer, a diplexer or a film bulk acoustic resonator (FBAR) filter. The matching circuit 811 is configured to match a wide range of impedances in the RF circuits (e.g. the RF circuit 302 of the semiconductor die 300). In some embodiments, as shown in FIG. 1, the matching circuit 811, the filter 818 and the antenna 820 are electrically connected in series by conductive routings 842. The antenna 820 is arranged close to an end of the off-die component circuit 810. In addition, one of the electrodes of the capacitor 814 is electrically coupled between the inductor structure 812 and the filter 818, and another of the electrodes of the capacitor 814 is electrically connected to a ground (GND) terminal 816 (electrically connected to ground).

As shown in FIG. 1, the substrate 200 of the semiconductor package assembly 600A includes a die-attach surface 202 and a solder-ball-attach surface 204 opposite to the die-attach surface 202. The semiconductor die 300 is mounted on and close to the die-attached surface 202 of the substrate 200. In addition, the solder-ball-attach surface 204 of the substrate 200 faces the base 800 and has conductive structures (not shown) thereon, so that the substrate 200 can be mounted on the corresponding pads on the base 800. In other words, the base 800 is mounted on the solder-ball-attach surface 204 of the substrate 200.

As shown in FIG. 1, the substrate 200 includes several discrete pads 214 and 216, conductive routings 217 and 218 and via structures 220 and 222. In some embodiments, the pads 214 and 216, conductive routings 217 and 218 and via structures 220 and 222 serve as interconnections of the substrate 200. The pads 214 and 216 may be disposed close to the die-attached surface 202. The pad 214 may be arranged close to the RF circuit 302, and the pads 216 are arranged close to the digital/analog circuit 304 of the semiconductor die 300. In some embodiments, the pad 214 is used for an input/output (I/O) connection of the RF circuit 302 of the semiconductor die 300. Therefore, the pad 214 may also serve as an RF pad of the substrate 200. In addition, the pads 216 may serve as input/output (I/O) connections for the digital/analog circuit 304 of the semiconductor die 300 . Therefore, the pads 216 also serve as digital/analog pads of the substrate 200.

As shown in FIG. 1, the conductive routings 217 and 218 and the via structures 220 and 222, which serves as interconnections of the substrate 200, are electrically connected to the pads 214 and 216. In some embodiments, the conductive routings 217 and 218 are disposed close to the die-attached surface 202, and the via structures 220 and 222 are formed through the substrate 200. Two terminals of each of the via structures 220 and 222 may be respectively close to the die-attach surface 202 and the solder-ball-attach surface 204. The conductive routing 217 is electrically connected to the pad 214 and the via structure 220. The conductive routings 218 are electrically connected to the pads 216 and the via structures 222. In addition, the via structure 220 is electrically connected to the pad 802 of the base 800. The via structure 222 are electrically connected to the pad 804 of the base 800.

In some embodiments, the substrate 200 may comprise a semiconductor substrate, such as a silicon substrate. In some other embodiments, the substrate 200 may comprise a dielectric material such as an organic material. In some embodiments, the organic material includes polypropylene (PP) with glass fiber, epoxy resin, polyimide, cyanate ester, other suitable materials, or a combination thereof.

As shown in FIG. 1, the semiconductor die 300 is mounted on and close to the die-attached surface 202 of the substrate 200 through an adhesive (not shown) between the semiconductor die 300 and the substrate 200. In addition, the semiconductor die 300 is mounted on the base 800 through the substrate 200 between the semiconductor die 300 and the base 800. In some embodiments, the semiconductor die 300 includes one or more RF circuits 302, one or more digital/analog circuits 304, several discrete pads 306 and 312 and conductive routing 376. In addition, the RF circuits 302 and the digital/analog circuits 304 are formed in the semiconductor die 300. The pads 306 and 312 and the conductive routing 376 may serve as interconnections of the RF circuits 302 and the digital/analog circuits 304 in the semiconductor die 300. The RF circuit 302 and the digital/analog circuits 304 are integrated into a single die (the semiconductor die 300). In some embodiments, the basic components of the RF circuit 302 include at least a receiver (Rx) or at least a transmitter (Tx). The RF circuit 302 may be also function as a victim circuit. In some embodiments, the basic components of the digital/analog circuits 304 include conductive routings, resistors, capacitors, inductors, diodes and transistors. The digital/analog circuits 304 may be also function as an aggressor circuit. The digital/analog circuits 304 may be electrically connected to the corresponding pads 312 through a conductive routing 376. In some embodiments, the conductive routing 376 includes contact structures, via structures and conductive traces in the semiconductor die 300.

As shown in FIG. 1, the pads 306 and 312 may be disposed close to a top surface 301 of the semiconductor die 300. In some embodiments, the pad 306 is arranged close to the RF circuit 302. In addition, the pad 306 may be used for an input/output (I/O) connection of the RF circuit 302 of the semiconductor die 300. Therefore, the pad 306 may also serve as an RF pad of the semiconductor die 300. The pads 312 may be arranged close to the digital/analog circuits 304. In addition, the pads 312 may serve as input/output (I/O) connections for the digital/analog circuits 304 of the semiconductor die 300. Therefore, the pads 312 also serve as digital/analog pads of the semiconductor die 300.

In some embodiments, the semiconductor die 300 is electrically connected to the substrate 200 through wire bonding technology. In some embodiments, and as shown in FIG. 1, the semiconductor die 300 is electrically connected to the substrate 200 through conductive structures comprising conductive wires, for example, conductive wires 210 and 212. For example, two terminals of the conductive wire 210 may be respectively electrically connected to the corresponding pad 306 of the semiconductor die 300 and the corresponding pad 214 of the substrate 200. For example, two terminals of each of the conductive wires 212 may be respectively electrically connected to the corresponding digital/analog pad 312 of the semiconductor die 300 and the corresponding digital/analog pad 216 of the substrate 200.

As shown in FIG. 1, the semiconductor package assembly 600A includes an inductor structure 350 disposed on or embedded in the semiconductor die 300 of the semiconductor package 500A. The inductor structure 350 may be arranged close to and electrically connected to the pad 306. In some embodiments, the inductor structure 350 includes two terminals 352 and 354 serving as pad regions. The terminal 352 of the inductor structure 350 may be electrically connected to the pad 306 through a conductive routing 374. In other words, the conductive routing 374 is the connection between the terminal 352 of the inductor structure 350 and the pad 306 of the semiconductor die 300. The conductive routing 374 includes contact structures, via structures and conductive traces in the semiconductor die 300. The terminal 354 of the inductor structure 350 may be electrically connected and shorted to a ground (GND) terminal 360A (i.e. electrically connected to ground). In some embodiments, no additional electronic device/component (e.g. the capacitors, filters or antennas) is coupled between the conductive routing 374 and the terminal 352 of the inductor structure 350, and between the ground (GND) terminal 360A and the terminal 354 of the inductor structure 350.

Figure 5A:
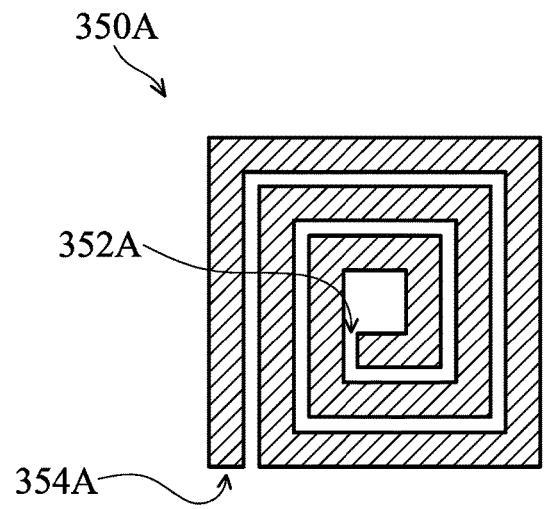
FIGS. 5A-5E are top views of a passive on-package inductor structure positioned on a semiconductor package assembly in accordance with some embodiments of the disclosure.
Figure 6:
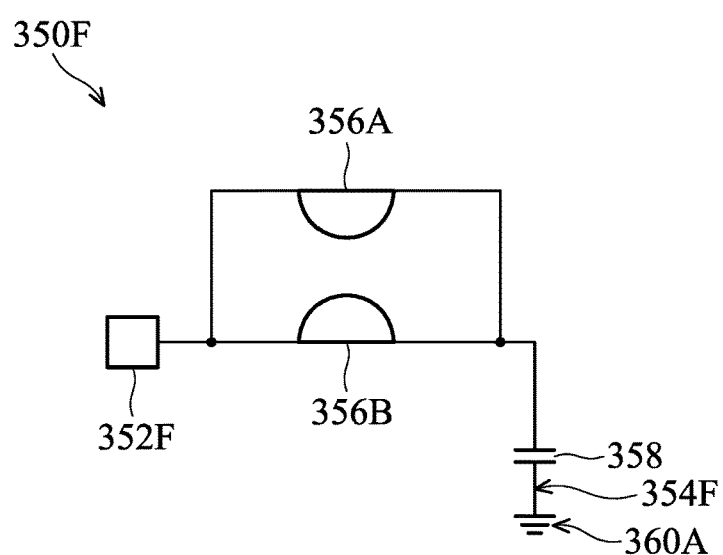
FIG. 6 is a circuit diagram of an active on-package inductor structure positioned on a semiconductor package assembly in accordance with some embodiments of the disclosure.

In some embodiments, the inductor structure 350 of the semiconductor package assembly 600A includes a passive inductor structure or an active inductor structure. For example, the passive inductor structure may include a square spiral-shaped conductive routing (e.g. an inductor structure 350A shown in FIG. 5A). As shown in FIG. 5A, the terminal 352A of the inductor structure 350A may be integrated with the interconnection of the semiconductor die 300 of the semiconductor package 500A. The terminal 352A of the inductor structure 350A may be electrically connected to the conductive routing 374 positioned between the RF circuit 302 and the pad 306. The terminal 354A of the inductor structure 350A may be electrically connected to a ground (GND) terminal 360A. In addition, other spiral-shaped inductor structures, for example, a hexagonal spiral-shaped inductor structure, an octagonal spiral-shaped inductor structure or a circular shape spiral-shaped inductor structure, may be used as the (passive) inductor structure 350. For example, the active inductor structure may include a classic gyrator-C active inductor structure, for example, an inductor structure 350F shown in FIG. 6. The active inductor structure 350F has two terminals 352F and 354F. The active inductor structure 350F may include a gyrator consisting of two back-to-back connected transconductors 356A and 356B. In addition, one port of the gyrator, which is close to a terminal 354F, is connected to a capacitor 358. A terminal 352F of the inductor structure 350F may be electrically connected to the conductive routing 374 connected to the pad 306. The terminal 354F of the inductor structure 350F may be close to the capacitor 358 and electrically connected to a ground (GND) terminal 360A.

In some embodiments, as shown in FIG. 1, the inductor structure 350 of the semiconductor package assembly 600A is formed in the interconnection (not shown) of the semiconductor die 300. Therefore, the inductor structure 350 of the semiconductor package assembly 600A may be an integrated passive device (IPD). In addition, the inductor structure 350 of the semiconductor package assembly 600A may be disposed directly on the top surface 301 of the semiconductor die 300. Therefore, the inductor structure 350 of the semiconductor package assembly 600A may be a surface mount device (SMT).

In some embodiments, the conductive path 372 may be formed by conductive components (including the inductor structure 812, the capacitor 814, the GND terminal 816, the filter 818 and the antenna 820) electrically connected to the pad 306 of the semiconductor die 300. In other words, the conductive path 372 is from antenna 820 to the pad 306 of the semiconductor die 300. The off-die component circuit 810 is a portion of the conductive path 372. In addition, a conductive path 370A may be formed by the inductor structure 350 electrically coupled between the pad 306 of the semiconductor die 300 and the ground (GND) terminal 360A. In other words, the conductive path 370A is from the terminal 354 of the inductor structure 350 to the pad 306 of the semiconductor die 300. The conductive path 370A is different from the conductive path 372. The inductor structure 812 and the inductor structure 350 are discrete inductor structures. Therefore, the pad 306 of the semiconductor die 300 is electrically coupled between the conductive path 370A and the conductive path 372. Furthermore, the antenna 820 mounted on the base 800 is electrically connected to the pad 306 of the semiconductor die 300 without passing through the inductor structure 350.

Because the two terminals of the conductive path 370A (i.e. the inductor structure 350) are electrically connected to and close to the pad 306 and the GND terminal 360A without using any additional electronic devices. In some embodiment, the length of the conductive path 370A is much shorter than the length of the conductive path 372. In other words, the distance (the length) of the conductive path 370A between the inductor structure 350 and the pad 306 is shorter than the distance (the length) of the conductive path 372 between the antenna 820 and the pad 306. In other embodiment, the length of the conductive routing 374 between the terminal 352 of the inductor structure 350 and the pad 306 is less than 1/5 length of a segment of the conductive path 372 which is arranged along the substrate 200 (for example, length of the conductive path 217 between the pad 306 and the pad 802). In some other embodiments, the length of the conductive routing 374 between the terminal 352 of the inductor structure 350 and the pad 306 is less than 1/10 length of a segment of the conductive path 372 which is arranged along the substrate 200 (for example, length of the conductive path 217 between the pad 306 and the pad 802). In some other embodiments, the inductor structure 350 may be arranged to directly connect the pad 306 and the conductive routing 374 could be omitted. The arrangement of the inductor structure 350 of the semiconductor package assembly 600A may protect the RF circuit 302 against noise interference (the noise coupling problem) from the digital/analog circuits 304 arranged in the same semiconductor die 300. Therefore, the noise immunity of the RF circuit 302 is improved. In more detail, noise immunity will be enhanced over 10 dB by this arrangement of the inductor structure 350.

Figure 2:
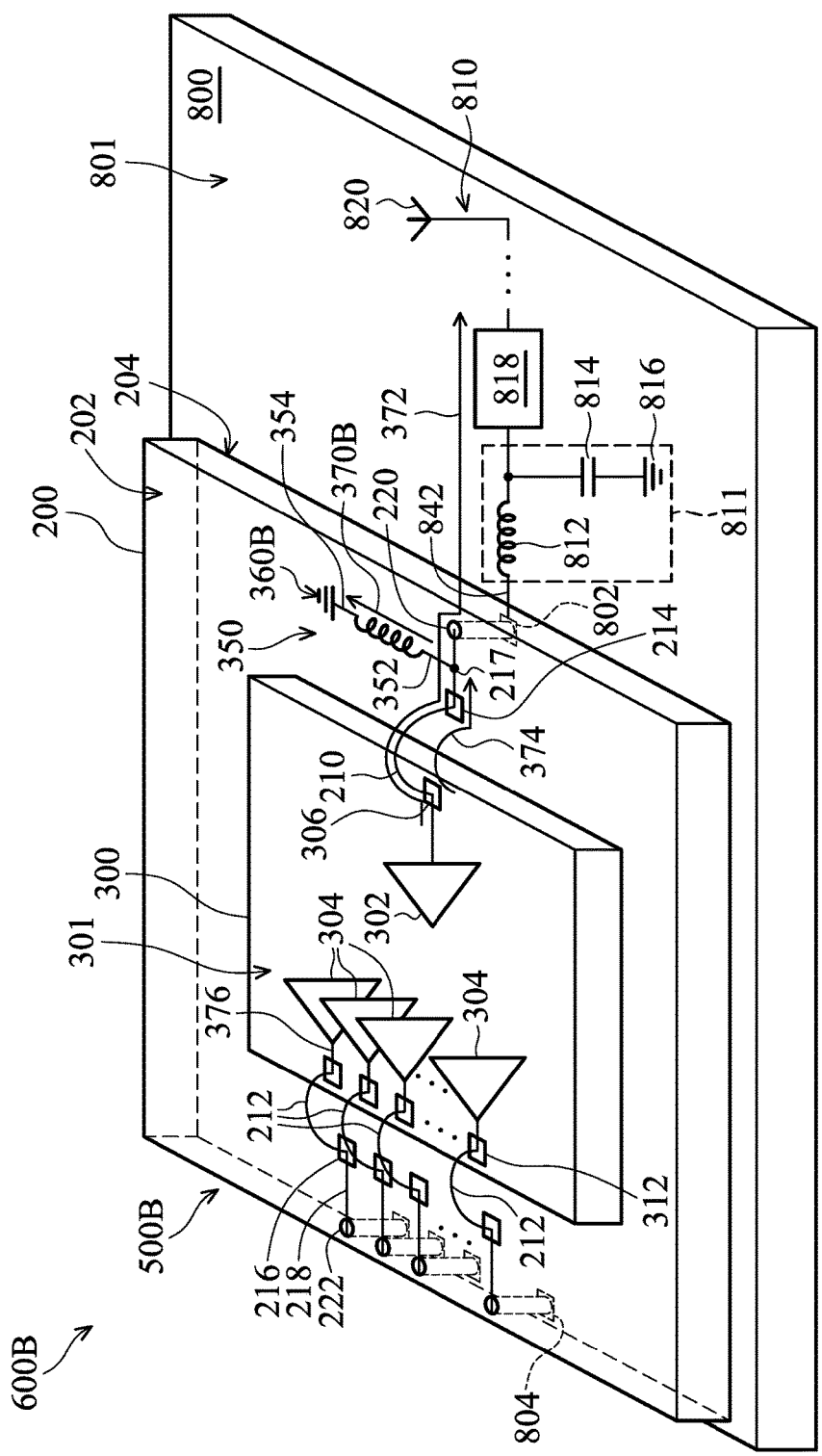

FIG. 2 is a circuit diagram of semiconductor package assembly 600B in accordance with some embodiments of the disclosure. In some embodiments, the semiconductor package assembly 600B includes a semiconductor package 500B (e.g. a radio frequency (RF) system-on-a-chip (SoC) package) mounted on a base 800. In addition, the semiconductor package 500B includes a semiconductor die 300 and a substrate 200. Elements of the embodiments hereinafter, that are the same or similar as those previously described with reference to FIG. 1, are not repeated for brevity. The semiconductor die 300 of the semiconductor package assembly 600B includes a pads 306 electrically connected to the RF circuit 302 of the semiconductor die 300. The off-die component circuit 810 on the base 800 is electrically connected to the pad 306 of the semiconductor die 300. The differences between the semiconductor package assembly 600A and the semiconductor package assembly 600B is that the terminal 352 of the inductor structure 350 is electrically connected and closed to (in some case, in physical contact) the pad 306 on the semiconductor die 300, and the other terminal 354 of the inductor structure 350 is electrically connected to a GND terminal 360B on the substrate 200, respectively.

As shown in FIG. 2, the pad 306 of the semiconductor die 300 may be arranged close to the RF circuit 302 rather than the digital/analog circuits 304. The terminal 352 of the inductor structure 350 is closed to (or in contact with) the pad 306, Therefore, in some embodiments, the terminal portion 352 of the inductor structure 350 is connected to the pad 306 through a conductive path 372, and the terminal 354 of the inductor structure 350 is short circuited to a GND terminal 360B directly on the die-attach surface 202 the substrate 200. In some embodiments, no additional electronic device/component (e.g. the capacitors, filters or antennas) is coupled between the pad 306 and the terminal 352 of the inductor structure 350, and between the ground (GND) terminal 360B and the terminal 354 of the inductor structure 350.

Figure 5B:
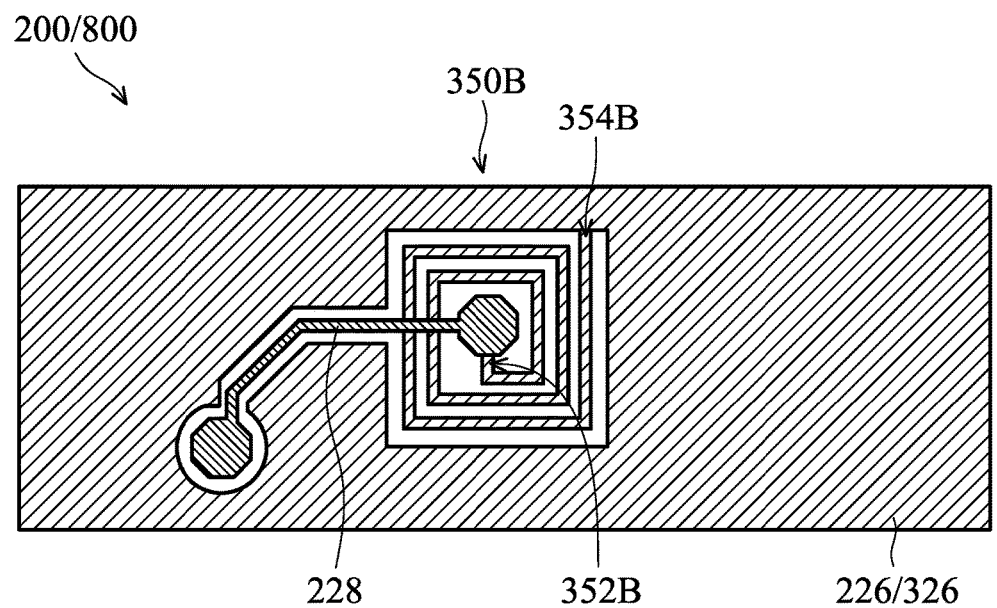
Figure 5C:
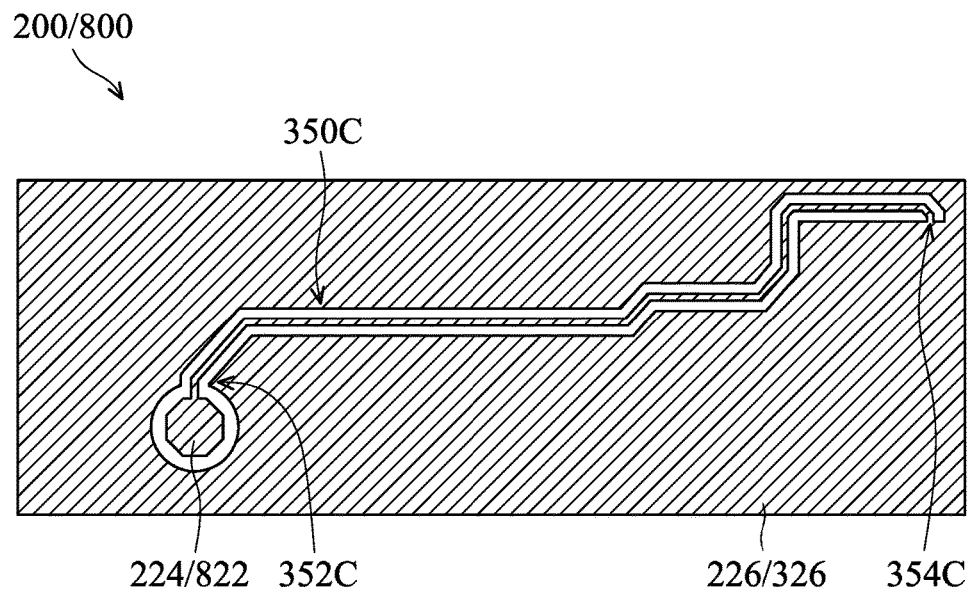
Figure 5D:
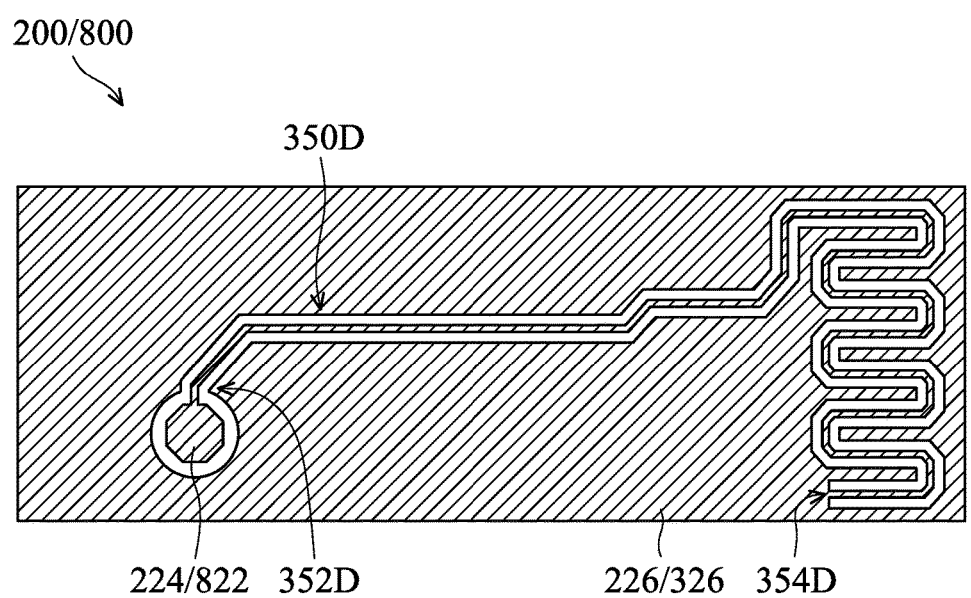
Figure 5E:
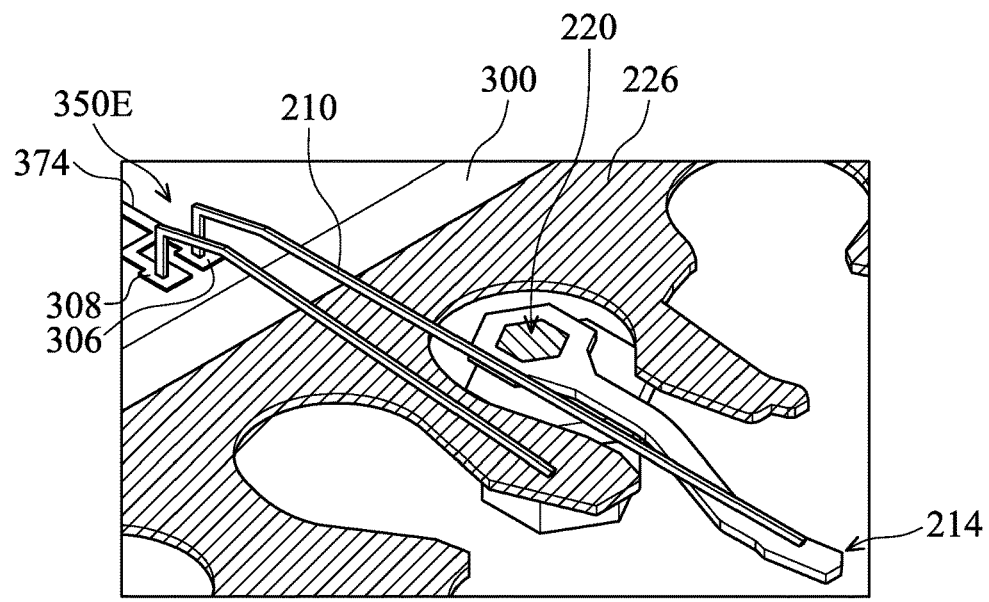

In some embodiments, the inductor structure 350 of the semiconductor package assembly 600B includes a bonding wire, for example, an inductor structure 350E shown in FIG. 5E. In addition, the GND terminal 360B may include a GND pad or a GND plane (e.g. a GND plane 226) on the substrate 200.

As shown in FIG. 5E, a bonding wire may be used as the inductor structure 350E. In addition, the inductor structure 350E may serve as a passive inductor structure. Terminals of the inductor structure 350E are electrically coupled and in contact with the pad 308 of the semiconductor die 300 and the GND plane 226 arranged on the die-attach surface of the substrate 200. The conductive wire 210 are electrically coupled and in contact with the pad 306 of the semiconductor die 300, the pad 214, the conductive routing 217 and the via structure 220.

In some embodiments, the off-die component circuit 810 on the base 800 is electrically connected to the pad 306 of the semiconductor die 300 through the conductive wire 210, the pad 214, the via structure 220 of the substrate 200 and the pad 802 of the base 800. Therefore, the conductive wire 210, the pad 214, the via structure 220, the pad 802 and the off-die component circuit 810, which are electrically connected to the pad 306 of the semiconductor die 300, form the conductive path 372.

In some embodiments, a conductive path 370B is formed by the inductor structure 350 electrically coupled between the pad 306 and the GND terminal 360B. In other words, the conductive path 370B is from the terminal 354 of the inductor structure 350 to the pad 306 of the semiconductor die 300. The conductive path 370B is different from the conductive path 372. The inductor structure 812 and the inductor structure 350 are discrete inductor structures. Therefore, the conductive path 370B is shunt with the conductive path 372 from the connection with the pad 306. Furthermore, the antenna 820 mounted on the base 800 is electrically connected to the pad 306 of the semiconductor die 300 without passing through the inductor structure 350.

Because the two terminals of the conductive path 370B (i.e. the inductor structure 350) are electrically connected to and close to (or in direct contact with) the pad 306 and the GND terminal 360B without using any additional electronic devices. The length of the conductive path 370B is much shorter than the length of the conductive path 372. In other words, the distance (the length) of the conductive path 370B between the inductor structure 350 and the RF pad 308 is shorter than the distance (the length) of the conductive path 372 between the antenna 820 and the RF pad 306. In other embodiment, the length of the conductive routing 374 between the terminal 352 of the inductor structure 350 and the pad 306 is less than 1/5 length of a segment of the conductive path 372 which is arranged along the substrate 200 (for example, length of the conductive path 217 between the pad 306 and the pad 802). In some other embodiments, the length of the conductive routing 374 between the terminal 352 of the inductor structure 350 and the pad 306 is less than 1/10 length of a segment of the conductive path 372 which is arranged along the substrate 200 (for example, length of the conductive path 217 between the pad 306 and the pad 802). In some other embodiments, the inductor structure 350 may be arranged to directly connect the pad 306 and the conductive routing 374 could be omitted. The arrangement of the inductor structure 350 may protect the RF circuit 302 against noise interference (the noise coupling problem) from the digital/analog circuit 304 in the same semiconductor die 300. Therefore, the noise immunity of the RF circuit 302 is improved. In more detail, noise immunity will be enhanced over 10 dB by this arrangement of the inductor structure 350.

Figure 3:
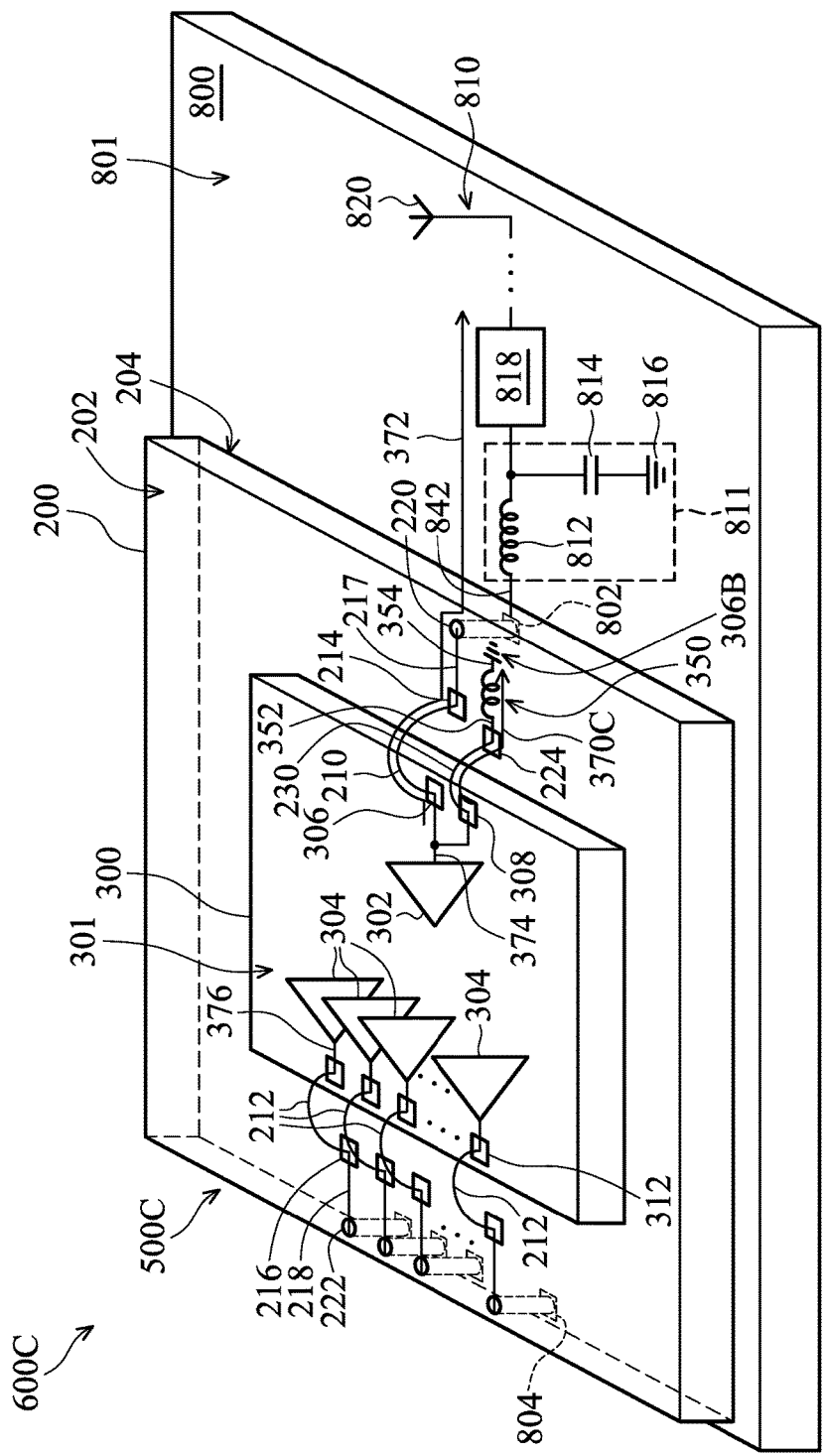

FIG. 3 is a circuit diagram of semiconductor package assembly 600C in accordance with some embodiments of the disclosure. In some embodiments, the semiconductor package assembly 600C includes a semiconductor package 500C (e.g. a radio frequency (RF) system-on-a-chip (SoC) package) mounted on the base 800. In addition, the semiconductor package 500C includes a semiconductor die 300 and a substrate 200. Elements of the embodiments hereinafter, that are the same or similar as those previously described with reference to FIGS. 1 and 2, are not repeated for brevity. The differences between the semiconductor package assembly 600B and the semiconductor package assembly 600C is that the semiconductor die 300 of the semiconductor package assembly 600C includes two discrete pads 306 and 308 both electrically connected to the RF circuit 302 of the semiconductor die 300, and the substrate 200 of the semiconductor package assembly 600C includes two discrete pads 214 and 224 electrically connected to the discrete pads 306 and 308, respectively. The two terminals of the inductor structure 350 are electrically connected to the pad 224 and a GND terminal 360B on the substrate 200, respectively. In some embodiments, as shown in FIG. 3, the RF circuit 302 of the semiconductor die 300 is coupled to the inductor structure 350 on the substrate 200 through a conductive wire 230. For example, two terminals of the conductive wire 230 may be respectively electrically connected to the corresponding pad 308 of the semiconductor die 300 and the corresponding pad 224 of the substrate 200. In some other embodiments, the terminal of the conductive wire 230 close to the semiconductor die 300 is electrically connected to the pad 306, and the pad 308 can be omitted.

In some embodiments, as shown in FIG. 3, the discrete pads 214 and 224 of the substrate 200 may be arranged close to the RF circuit 302 of the semiconductor die 300. The discrete pads 214 and 224 may be electrically connected to the RF circuit 302 through the pads 306 and 308 and the conductive wires 210 and 230. The terminal 352 of the inductor structure 350 is in contact with the pad 224, and the terminal 354 of the inductor structure 350 is short circuited to the GND terminal 360B directly on the die-attach surface 202 the substrate 200. In some embodiments, no additional electronic device/component (e.g. the capacitors, filters or antennas) is coupled between the pad 308 and the terminal 352 of the inductor structure 350, and between the ground (GND) terminal 360B and the terminal 354 of the inductor structure 350. In some embodiments, the terminal 352 of the inductor structure 350 is electrically connected to the pad 306 of the semiconductor die 300 through a conductive path 374.

In some embodiments, the inductor structure 350 of the semiconductor package assembly 600C includes a passive inductor structure, for example, the passive inductor structure including a spiral-shaped conductive routing (e.g. an inductor structure 350B shown in FIG. 5B), a stub-shaped conductive routing (e.g. an inductor structure 350C shown in FIG. 5C) or a meander line-shaped conductive routing (e.g. an inductor structure 350D shown in FIG. 5D). In addition, the GND terminal 360B may include a GND pad or a GND plane (e.g. the GND plane 226 shown in FIGS. 5B-5D) on the substrate 200.

As shown in FIG. 5B, the inductor structure 350B is square spiral-shaped. The inductor structure 350B may be a portion of the GND plane 226 of the substrate 200. The terminal 352B of the inductor structure 350B may be electrically connected to the pad 224 of the substrate 200 through a conductive routing 228. The terminal 354A of the inductor structure 350A may be electrically connected to the GND plane 226 (serving as the GND terminal 360B). In addition, other spiral-shaped inductor structures, for example, a hexagonal spiral-shaped inductor structure, an octagonal spiral-shaped inductor structure or a circular shape spiral-shaped inductor structure, may be used as the (passive) inductor structure 350.

As shown in FIG. 5C, the inductor structure 350C is stub-shaped. The inductor structure 350C may be a portion of the GND plane 226 of the substrate 200. The terminal 352C of the inductor structure 350C may be electrically connected to the pad 224 of the substrate 200. The terminal 354C of the inductor structure 350C may be electrically connected to the GND plane 226 (serving as the GND terminal 360B).

As shown in FIG. 5D, the inductor structure 350D is meander line-shaped. The inductor structure 350D may be a portion of the GND plane 226 of the substrate 200. The terminal 352D of the inductor structure 350D may be electrically connected to the pad 224 of the substrate 200. The terminal 354D of the inductor structure 350D may be electrically connected to the GND plane 226 (serving as the GND terminal 360B).

In some embodiments, as shown in FIG. 3, the inductor structure 350 of the semiconductor package assembly 600C is formed embedded in the interconnection (not shown) of the substrate 200. Therefore, the inductor structure 350 of the semiconductor package assembly 600C may be an integrated passive device (IPD). In addition, the inductor structure 350 of the semiconductor package assembly 600V may be disposed directly on the die-attach surface 202 of the substrate 200. Therefore, the inductor structure 350 of the semiconductor package assembly 600C may be a surface mount device (SMT).

In some embodiments, the off-die component circuit 810 on the base 800 is electrically connected to the pad 306 of the semiconductor die 300 through the conductive wire 210, the pad 214, the via structure 220 of the substrate 200 and the pad 802 of the base 800. Therefore, the conductive wire 210, the pad 214, the via structure 220, the pad 802 and the off-die component circuit 810, which are electrically connected to the pad 306 of the semiconductor die 300, form the conductive path 372.

In some embodiments, the inductor structure 350 is electrically connected to the pad 308 of the Semiconductor die 300 through the conductive wire 230 and the pad 224 of the substrate 200. Therefore, the conductive wire 230, the pad 224 of the substrate 200 and the inductor structure 350, which are electrically coupled between the pad 308 and the GND terminal 360B, form a conductive path 370C. In other words, the conductive path 370C is from the terminal 354 of the inductor structure 350 to the pad 308 of the semiconductor die 300. The conductive path 370C is different from the conductive path 372. For example, the conductive path 370C may include the inductor structure 350, the conductive wire 230 and the pad 224. The inductor structure 812 and the inductor structure 350 are discrete inductor structures. Therefore, the pads 306 and 308 of the semiconductor die 300 are electrically coupled between the conductive path 370C and the conductive path 372. Furthermore, the antenna 820 mounted on the base 800 is electrically connected to the pad 306 of the semiconductor die 300 without passing through the inductor structure 350 on the substrate 200.

In some embodiments, the conductive wire 230, the pad 224 and the inductor structure 350 may collectively form a composite inductor structure of the semiconductor package assembly 600C. Therefore, two terminals of the composite inductor structure are in contact with the pad 308 connected to the RF circuit 302 and the GND terminal 360B on the substrate 200.

In some embodiments, the inductor structure 350 of the semiconductor package assembly 600C disposed directly on the solder-ball-attach surface 203 opposite to the die-attach surface 201 of the substrate 200. The inductor structure 350 may be electrically connected to the pad 224 through other via structure (not shown) of the substrate 200.

Because the two terminals of the conductive path 370C (the conductive path 370C includes the inductor structure 350, the conductive wire 230 and the pad 224) are electrically connected to and close to the pad 308 and the GND terminal 360B without passing through any additional electronic devices. The length of the conductive path 370C is much shorter than the length of the conductive path 372. In other words, the distance (the length) of the conductive path 370C between the inductor structure 350 and the pad 308 is shorter than the distance (the length) of the conductive path 372 between the antenna 820 and the pad 306. In other embodiment, the length of the conductive routing 374 between the terminal 352 of the inductor structure 350 and the pad 306 is less than ⅕ length of a segment of the conductive path 372 which is arranged along the substrate 200 (for example, length of the conductive path 217 between the pad 306 and the pad 802). In some other embodiments, the length of the conductive routing 374 between the terminal 352 of the inductor structure 350 and the pad 306 is less than 1/10 length of a segment of the conductive path 372 which is arranged along the substrate 200 (for example, length of the conductive path 217 between the pad 306 and the pad 802). In some other embodiments, the inductor structure 350 may be arranged to directly connect the pad 306 and the conductive routing 374 could be omitted. The arrangement of the inductor structure 350 may protect the RF circuit 302 against noise interference (the noise coupling problem) from the digital/analog circuit 304 in the same semiconductor die 300. Therefore, the noise immunity of the RF circuit 302 is improved. In more detail, the noise will be reduced at least 10 dB by this arrangement of the inductor structure 350. The arrangement of the inductor structure 350 may protect the RF circuit 302 against noise interference (the noise coupling problem) from the digital/analog circuit 304 in the same semiconductor die 300. Therefore, the noise immunity of the RF circuit 302 is improved. In more detail, noise immunity will be enhanced over 10 dB by this arrangement of the inductor structure 350.

Figure 4:
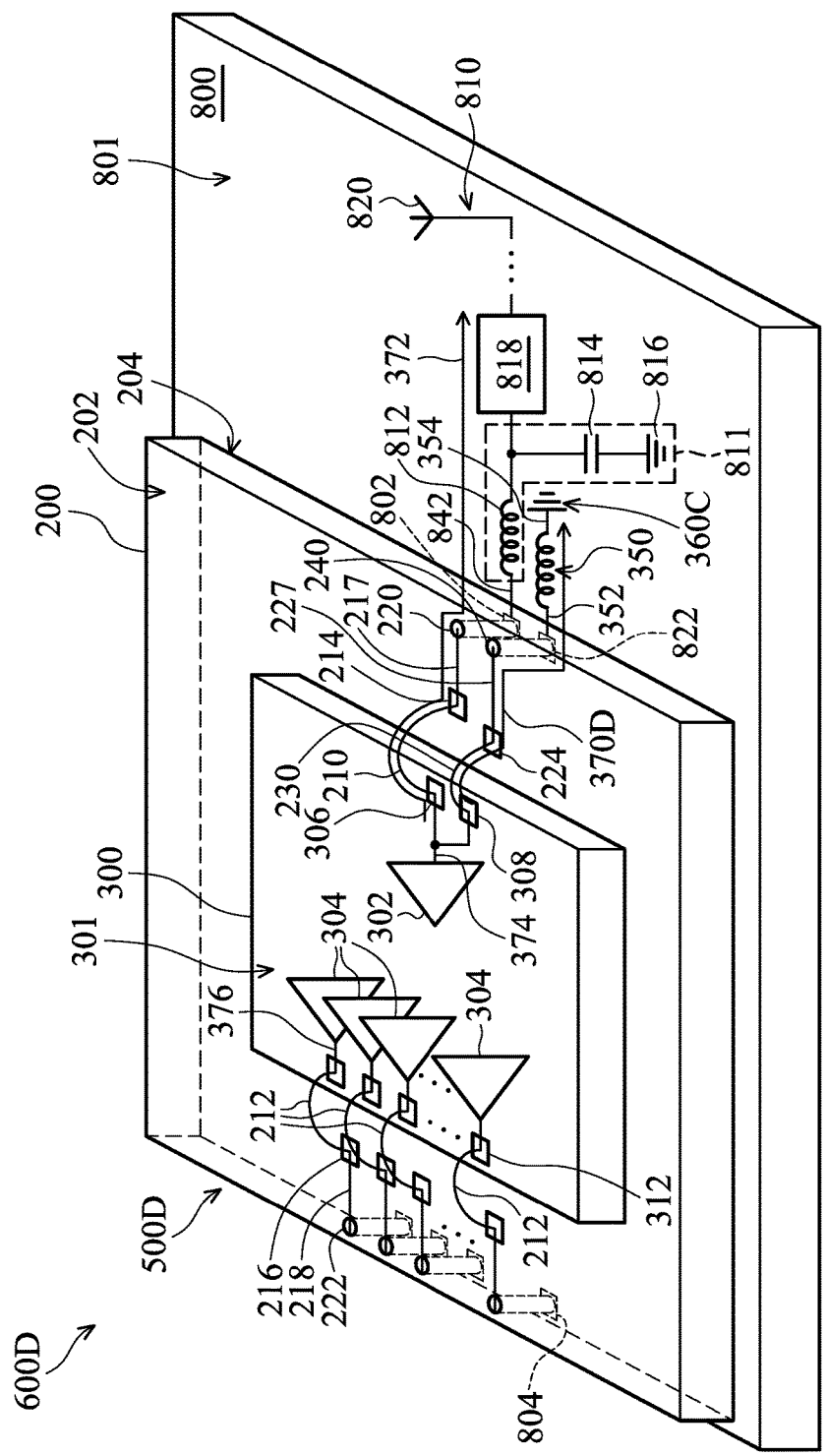

FIG. 4 is a circuit diagram of semiconductor package assembly 600D in accordance with some embodiments of the disclosure. In some embodiments, the semiconductor package assembly 600D includes a semiconductor package 500D (e.g. a radio frequency (RF) system-on-a-chip (SoC) package) mounted on the base 800. In addition, the semiconductor package 500D includes the semiconductor die 300 and the substrate 200. Elements of the embodiments hereinafter, that are the same or similar as those previously described with reference to FIGS. 1-3, are not repeated for brevity. The differences between the semiconductor package assembly 600C and the semiconductor package assembly 600D is that the inductor structure 350 of the semiconductor package assembly 600D is arranged directly on or embedded in the base 800.

In some embodiments, the base 800 of the semiconductor package assembly 600D includes several discrete pads 802, 804 and 822, the off-die component circuit 810, the inductor structure 350 and a GND terminal 360C disposed close to the package-attach surface 801. The pad 802 may serve as the input/output (I/O) connection for the RF circuit 302 of the semiconductor die 300. In addition, the off-die component circuit 810 is electrically connected to the pad 802. Furthermore, the pads 804 may serve as input/output (I/O) connections for the digital/analog circuit 304 of the semiconductor die 300. In some embodiments, the pad 822 serves as an electrical connection between the RF circuit 302 of the semiconductor die 300 and the inductor structure 350 on the base 800. In addition, the terminal 352 of the inductor structure 350 is in contact with the pad 822, and the terminal 354 of the inductor structure 350 is short circuited to the GND terminal 360C of the base 800. In some embodiments, no additional electronic device/component (e.g. the capacitors, filters or antennas) is coupled between the pad 308 and the terminal 352 of the inductor structure 350, and between the ground (GND) terminal 360C and the terminal 354 of the inductor structure 350.

In some embodiments, the inductor structure 350 of the semiconductor package assembly 600D includes a passive inductor structure, for example, the passive inductor structure including a spiral-shaped conductive routing (e.g. the inductor structure 350B shown in FIG. 5B), a stub-shaped conductive routing (e.g. the inductor structure 350C shown in FIG. 5C) or a meander line-shaped conductive routing (e.g. the inductor structure 350D shown in FIG. 5D). In addition, the GND terminal 360C may include a GND pad or a GND plane (e.g. a GND plane 326 shown in FIGS. 5B-5D) on the base 800.

As shown in FIG. 5B, the inductor structure 350B is a square spiral-shaped. The inductor structure 350B may be a portion of the GND plane 326 of the base 800. The terminal 352B of the inductor structure 350B may be electrically connected to the pad 822 of the base 800 through the conductive routing 228. The terminal 354A of the inductor structure 350A may be electrically connected to the GND plane 326 (serving as the GND terminal 360C). In addition, other spiral-shaped inductor structures, for example, a hexagonal spiral-shaped inductor structure, an octagonal spiral-shaped inductor structure or a circular shape spiral-shaped inductor structure, may be used as the (passive) inductor structure 350.

As shown in FIG. 5C, the inductor structure 350C is stub-shaped. The inductor structure 350C may be a portion of the GND plane 326 of the base 800. The terminal 352C of the inductor structure 350C may be electrically connected to the pad 822 of the base 800. The terminal 354C of the inductor structure 350C may be electrically connected to the GND plane 326 (serving as the GND terminal 360C).

As shown in FIG. 5D, the inductor structure 350D is meander line-shaped. The inductor structure 350D may be a portion of the GND plane 326 of the base 800. The terminal 352D of the inductor structure 350D may be electrically connected to the pad 822 of the base 800. The terminal 354D of the inductor structure 350D may be electrically connected to the GND plane 326 (serving as the GND terminal 360C).

In some embodiments, as shown in FIG. 4, the inductor structure 350 of the semiconductor package assembly 600D is formed embedded in or directly on the package-attach surface 801 of the base 800. For example, the inductor structure 350 may be formed embedded in the base 800 and close to the package-attach surface 801 of the base 800. The inductor structure 350 may be formed simultaneously with conductive routings (e.g. the conductive routings connected to the electrical components of the off-die component circuit 810) of the base 800. Therefore, the inductor structure 350 of the semiconductor package assembly 600D may be an integrated passive device (IPD). In addition, the inductor structure 350 of the semiconductor package assembly 600D may be disposed directly on the package-attach surface 801 of the base 800. Therefore, the inductor structure 350 of the semiconductor package assembly 600D may be a surface mount device (SMT).

In some embodiments, the inductor structure 350 of the semiconductor package assembly 600D disposed directly on a surface opposite to the package-attach surface 801 of the base 800. The inductor structure 350 may be electrically connected to the pad 822 through a via structure (not shown) of the base 800.

In some embodiments, as shown in FIG. 4, the substrate 200 of the semiconductor package assembly 600D includes the discrete pads 214 and 224, discrete conductive routings 217 and 227 and discrete via structures 220 and 240, which are arranged close to and electrically connected to the RF circuit 302 of the semiconductor die 300. Two terminals of the via structure 220 are respectively electrically connected to the conductive routing 217 and the pad 802 of the base 800. Two terminals of the via structure 240 are electrically connected to the conductive routing 227 and the pad 822 of the base 800. The conductive routing 217 and the via structure 220 electrically connected to the conductive routing 217 may serve as the interconnection between the pad 214 of the substrate 200 and the pad 802 of the base 800. In addition, the conductive routing 227 and the via structure 240 electrically connected to the conductive routing 227 may serve as another interconnection between the pad 224 of the substrate 200 and the pad 822 of the base 800. In some embodiments, the structure of the conductive routing 227 is similar to or the same as the structure of conductive routing 217. The structure of the via structure 240 may be similar to or the same as the structure of via structure 220.

In some embodiments, the inductor structure 350 is electrically connected to the pad 308 close to the RF circuit 302 of the semiconductor die 300 through the conductive wire 230, the pad 224, the conductive routing 227, the via structure 240 and the pad 822. In some embodiments, the conductive wire 230, the pad 224, the conductive routing 227, the via structure 240, the pad 822 and the inductor structure 350, which are electrically coupled between the pad 308 and the GND terminal 360C forms a conductive path 370D. In other words, the conductive path 370D is from the terminal 354 of the inductor structure 350 to the RF pad 308 of the semiconductor die 300. The conductive path 370D is different from the conductive path 372. The inductor structure 812 and the inductor structure 350 are discrete inductor structures. Therefore, the pads 306 and 308 of the semiconductor die 300 are electrically coupled between the conductive path 370D and the conductive path 372. Furthermore, the antenna 820 mounted on the base 800 is electrically connected to the RF pad 306 of the semiconductor die 300 without passing through the inductor structure 350 on the base 800.

In some embodiments, the conductive wire 230, the pad 224, the conductive routing 227, the via structure 240, the pad 822 and the inductor structure 350 may collectively form a composite inductor structure of the semiconductor package assembly 600D. Therefore, two terminals of the composite inductor structure are in contact with the pad 308 connected to the RF circuit 302 and the GND terminal 360C on the base 800.

Because the two terminals of the conductive path 370D (the conductive path 370D includes the inductor structure 350, the conductive wire 230, the pad 224, the conductive routing 227, the via structure 240 and the pad 822) are electrically connected to and close to the pad 308 and the GND terminal 360C without using any additional electronic devices. The length of the conductive path 370D is much shorter than the length of the conductive path 372. In other words, the distance (the length) of the conductive path 370D between the inductor structure 350 and the pad 308 is shorter than the distance (the length) of the conductive path 372 between the antenna 820 and the pad 306. The arrangement of the inductor structure 350 may protect the RF circuit 302 against noise interference (the noise coupling problem) from the digital/analog circuit 304 in the same semiconductor die 300. Therefore, the noise immunity of the RF circuit 302 is improved.

Embodiments provide a semiconductor package assembly. The semiconductor package assembly includes a radio frequency (RF) system-on-a-chip (SoC) package assembly with an on-package inductor structure for enhancement of the coupled noise immunity. The semiconductor package assembly includes an semiconductor die having an RF circuit and a digital/analog circuit integrated therein. The RF circuit is connected to a matching circuit on a base through a corresponding RF. An RF conductive path between the pad and an antenna of the matching circuit may be function as the victim circuit of the semiconductor package assembly. In addition, the digital/analog circuit may be function as serve as the aggressor circuit of the semiconductor package assembly. The semiconductor package assembly uses an on-package inductor structure arranged close to the RF pad on the RF conductive path. In some embodiments, the on-package inductor structure provides a shunt path of the RF conductive path and short circuited to the GND terminal without using any additional electronic devices. The arrangement of the inductor structure 350 may couple the noise from the digital/analog circuit in the same semiconductor die 300. Therefore, the noise immunity of the RF circuit is improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
   a substrate having a die-attach surface and a solder-ball-attach surface opposite to the die-attach surface;
   a semiconductor die mounted on the die-attach surface of the substrate, wherein the semiconductor die comprises:
   a radio-frequency (RF) circuit; and
   a first die pad electrically connected to the RF circuit;
   a base mounted on the solder-ball-attach surface of the substrate; and
   a first inductor structure on the substrate, the semiconductor die or the base, wherein the inductor structure comprises:
   a first terminal electrically connected to the first die pad; and
   a second terminal electrically connected to a ground terminal.

2. The semiconductor package assembly as claimed in claim 1, wherein a first distance of a first conductive path from the first terminal of the first inductor structure to the first die pad is shorter than 1/5 length of a segment of a second conductive path arranged along the substrate, wherein the second conductive path is from the antenna to the first die pad.

3. The semiconductor package assembly as claimed in claim 2, wherein the first distance of the first conductive path from the first terminal of the first inductor structure to the first die pad is shorter than 1/10 length of the segment of the second conductive path arranged along the substrate.

4. The semiconductor package assembly as claimed in claim 1, wherein the first terminal of the first inductor structure directly contacts the first die pad.

5. The semiconductor package assembly as claimed in claim 1, wherein the inductor structure directly on the semiconductor die comprises an active inductor structure.

6. The semiconductor package assembly as claimed in claim 1, wherein the inductor structure comprises a passive inductor structure comprising a stub-shaped inductor structure, a meander line-shaped inductor structure or a spiral-shaped inductor structure.

7. The semiconductor package assembly as claimed in claim 5, wherein the passive inductor structure comprises a square spiral-shaped inductor structure, a hexagonal spiral inductor structure, an octagonal inductor structure or a circular inductor structure.

8. The semiconductor package assembly as claimed in claim 5, wherein the inductor structure comprises a classic gyrator-C active inductor structure.

9. The semiconductor package assembly as claimed in claim 1, wherein the passive inductor structure comprises an integrated passive device (IPD), a surface mount device (SMT) or a bonding wire.

10. The semiconductor package assembly as claimed in claim 1, wherein the substrate comprises:
a first pad on the die-attach surface of the substrate;
a conductive routing close to the die-attach surface of the substrate and electrically connected to the first pad; and
a via structure through the substrate and electrically connected to the conductive routing; and
wherein the base comprises:
a second pad on the solder-ball-attach surface, wherein the second pad is electrically connected to the via structure and the first terminal of the first
wherein the first inductor structure directly on the base, the first pad, the conductive routing, the via structure and the second pad are collectively form a composite inductor structure.

11. The semiconductor package assembly as claimed in claim 1, wherein the inductor structure is in contact with the semiconductor die, the substrate, or the base.

12. The semiconductor package assembly as claimed in claim 1, wherein the semiconductor die comprises:
a second die pad, wherein the second die pad is electrically connected to the RF circuit of the semiconductor die and an antenna on the base, wherein the first inductor structure is separated from the second die pad by the first die pad.

13. The semiconductor package assembly as claimed in claim 1, further comprising:
a off-die component circuit electrically connected to the RF circuit of the semiconductor die, wherein the off-die component circuit comprises a matching circuit, a filter and the antenna.

14. The semiconductor package assembly as claimed in claim 13, wherein the matching circuit comprising a second inductor structure, wherein the first inductor structure and the second inductor structure are discrete inductor structures.

15. The semiconductor package assembly as claimed in claim 1, wherein the semiconductor die comprises:
a digital/analog circuit; and
a digital/analog die pad electrically connected to the digital/analog circuit.

16. The semiconductor package assembly as claimed in claim 15, wherein the first die pad and the digital/analog die pad are discrete die pads.

17. The semiconductor package assembly as claimed in claim 1, wherein a third distance of a third conductive path from the second terminal of the first inductor structure to the first die pad is shorter than the second distance of the second conductive path from the antenna to the first die pad.

18. A semiconductor package assembly, comprising:
a semiconductor die mounted on a base, wherein the semiconductor die comprises:
a radio-frequency (RF) circuit; and
a first die pad electrically connected to the RF circuit;
a substrate between the semiconductor die and the base; and
a first inductor structure on the substrate, the semiconductor die or the base, wherein the inductor structure comprises:
a first terminal electrically connected to the first die pad; and
a second terminal electrically connected to a ground terminal; and
an antenna on the base and electrically connected to the first die pad without passing through the first inductor structure.

19. The semiconductor package assembly as claimed in claim 18, wherein a first distance of a first conductive path from the first terminal of the first inductor structure to the first die pad is shorter than 1/5 length of a segment of a second conductive path arranged along the substrate, wherein the second conductive path is from the antenna to the first die pad.

20. The semiconductor package assembly as claimed in claim 19, wherein the first distance of the first conductive path from the first terminal of the first inductor structure to the first die pad is shorter than 1/10 length of the segment of the second conductive path arranged along the substrate.

21. The semiconductor package assembly as claimed in claim 18, wherein the first terminal of the first inductor structure directly contacts the first die pad.

22. The semiconductor package assembly as claimed in claim 18, wherein a third distance of a third conductive path from the second terminal of the first inductor structure to the first die pad is shorter than the second distance of the second conductive path from the antenna to the first die pad.

23. The semiconductor package assembly as claimed in claim 18, wherein the first inductor structure is in contact with the semiconductor die, the base, or the substrate.

24. The semiconductor package assembly as claimed in claim 18, wherein the RF circuit comprises a receiver or a transmitter.

25. The semiconductor package assembly as claimed in claim 18, wherein the semiconductor die comprises:
a second die pad electrically connected to the RF circuit and the antenna, wherein the first inductor structure is separated from the second die pad by the first die pad.

26. The semiconductor package assembly as claimed in claim 25, further comprising:
an off-die component circuit electrically connected to the second die pad, wherein the off-die component circuit comprises a matching circuit, a filter and the antenna.

27. The semiconductor package assembly as claimed in claim 26, wherein the matching circuit is a portion of the second conductive path.

28. The semiconductor package assembly as claimed in claim 18, wherein the semiconductor die comprises:
a digital/analog circuit; and
a digital/analog die pad electrically connected to the digital/analog circuit.

29. A semiconductor package assembly, comprising:
a semiconductor die mounted on a base, wherein the semiconductor die comprises:
a radio-frequency (RF) circuit; and
a first die pad electrically connected to the RF circuit; a substrate between the semiconductor die and the base; and
a first inductor structure on the substrate, the semiconductor die or the base, wherein the inductor structure comprises:
a first terminal electrically connected to the first die pad; and
a second terminal electrically connected to ground; and
an antenna on the base and electrically connected to the first die pad,
wherein a first distance of a first conductive path from the second terminal of the first inductor structure to the first die pad is shorter than a second distance of a second conductive path from the antenna to the first die pad,
wherein the first die pad is between the first conductive path and the second conductive path.

30. The semiconductor package assembly as claimed in claim 29, wherein a first distance of a first conductive path from the first terminal of the first inductor structure to the first die pad is shorter than ⅕ length of a segment of a second conductive path arranged along the substrate.

31. The semiconductor package assembly as claimed in claim 30, wherein the first distance of the first conductive path from the first terminal of the first inductor structure to the first die pad is shorter than ¹⁄₁₀ length of the segment of the second conductive path arranged along the substrate.

32. The semiconductor package assembly as claimed in claim 29, wherein the first terminal of the first inductor structure directly contacts the first die pad.

33. The semiconductor package assembly as claimed in claim 29, wherein the first inductor structure is in contact with the semiconductor die, the base, or the substrate.

34. The semiconductor package assembly as claimed in claim 29, wherein the semiconductor die comprises:
a second die pad electrically connected to the RF circuit and the antenna, wherein the first inductor structure is separated from the second die pad by the first die pad.

35. The semiconductor package assembly as claimed in claim 34, further comprising:
an off-die component circuit electrically connected to the second die pad, wherein the off-die component circuit comprises a matching circuit, a filter and the antenna.

36. The semiconductor package assembly as claimed in claim 29, wherein the semiconductor die comprises:
a digital/analog circuit; and
a digital/analog die pad electrically connected to the digital/analog circuit.

* * * * *